United States Patent
Ichinose

(10) Patent No.: US 11,711,919 B2
(45) Date of Patent: Jul. 25, 2023

(54) SEMICONDUCTOR MEMORY DEVICE

(71) Applicant: Kioxia Corporation, Tokyo (JP)

(72) Inventor: Daigo Ichinose, Nagoya (JP)

(73) Assignee: Kioxia Corporation, Tokyo (JP)

( * ) Notice: Subject to any disclaimer, the term of this patent is extended or adjusted under 35 U.S.C. 154(b) by 214 days.

(21) Appl. No.: 17/020,418

(22) Filed: Sep. 14, 2020

(65) Prior Publication Data

US 2021/0296357 A1 Sep. 23, 2021

(30) Foreign Application Priority Data

Mar. 18, 2020 (JP) ................................. 2020-047191

(51) Int. Cl.
*H01L 27/06* (2006.01)
*H01L 49/02* (2006.01)
(Continued)

(52) U.S. Cl.
CPC ......... *H10B 43/27* (2023.02); *H01L 23/5226* (2013.01); *H10B 41/10* (2023.02); *H10B 41/27* (2023.02); *H10B 43/10* (2023.02)

(58) Field of Classification Search
CPC ........... H01L 27/11524; H01L 27/1157; H01L 27/11578; H01L 27/11582; H01L 29/4234; H01L 29/66833; H01L 29/518; H01L 29/7808; H01L 27/11273; H01L 29/7802; H01L 27/11517; H01L 29/42324; H01L 29/66825; H01L 29/792; H01L 2924/13081; H01L 2924/13085; H01L 29/6684; H01L 29/78391; H01L 29/4236; H01L 29/66712; H01L 29/788; H01L 29/7926; H10B 43/10; H10B 43/27
See application file for complete search history.

(56) References Cited

U.S. PATENT DOCUMENTS 9,299,447 B2 * 3/2016 Lee ........................ G11C 16/28
9,406,814 B2    8/2016 Shinohara
(Continued)

FOREIGN PATENT DOCUMENTS

JP   2015-28990 A   2/2015
JP   2015-149413 A  8/2015

*Primary Examiner* — Mary A Wilczewski
*Assistant Examiner* — Tsz K Chiu
(74) *Attorney, Agent, or Firm* — Oblon, McClelland, Maier & Neustadt, L.L.P.

(57) ABSTRACT

A semiconductor memory device comprises: a plurality of first conductive layers arranged separated from each other in a first direction; a plurality of second conductive layers arranged, electrically insulated from the plurality of first conductive layers, at a different position in a second direction intersecting the first direction with respect to the first conductive layers; a plurality of memory structures; and a source structure. Respective one ends of the plurality of memory structures and one end of the source structure are electrically connected. The respective other ends of the plurality of memory structures are respectively electrically connected to different first wirings of a plurality of first wirings formed in the same layer in the first direction. The other end of the source structure is electrically connected to a second wiring formed in a different layer from the plurality of first wirings in the first direction.

14 Claims, 13 Drawing Sheets

(51) Int. Cl.
*H01L 27/115* (2017.01)
*H10B 43/27* (2023.01)
*H01L 23/522* (2006.01)
*H10B 41/10* (2023.01)
*H10B 41/27* (2023.01)
*H10B 43/10* (2023.01)

(56) References Cited

U.S. PATENT DOCUMENTS

| | | | |
|---|---|---|---|
| 9,520,407 B2 | 12/2016 | Fukuzumi et al. | |
| 10,741,573 B2* | 8/2020 | Oike | H01L 23/528 |
| 10,770,117 B1* | 9/2020 | Takekida | G11C 16/3445 |
| 2012/0083077 A1* | 4/2012 | Yang | H10B 43/27 |
| | | | 438/479 |
| 2012/0098049 A1* | 4/2012 | Moon | H10B 43/27 |
| | | | 257/324 |
| 2012/0134210 A1* | 5/2012 | Maeda | G11C 16/0483 |
| | | | 365/185.11 |
| 2012/0134215 A1* | 5/2012 | Goda | H01L 29/7926 |
| | | | 257/314 |
| 2014/0355346 A1* | 12/2014 | Park | G11C 16/3427 |
| | | | 365/185.11 |
| 2018/0269203 A1* | 9/2018 | Nojima | H01L 27/115 |
| 2019/0088672 A1* | 3/2019 | Tomimatsu | H01L 27/11582 |
| 2019/0371811 A1* | 12/2019 | Oike | H01L 27/11582 |
| 2019/0371813 A1* | 12/2019 | Oike | H01L 23/528 |
| 2020/0075625 A1* | 3/2020 | Kobayashi | H01L 27/11582 |
| 2020/0303415 A1* | 9/2020 | Oike | H01L 27/11582 |

* cited by examiner

SEMICONDUCTOR MEMORY DEVICE

CROSS-REFERENCE TO RELATED APPLICATIONS

This application is based upon and claims the benefit of Japanese Patent Application No. 2020-047191, filed on Mar. 18, 2020, the entire contents of which are incorporated herein by reference.

BACKGROUND

Field

The present embodiment relates to a semiconductor memory device.

Description of the Related Art

There is known a semiconductor memory device that comprises: a substrate; a plurality of conductive layers; a semiconductor layer facing the plurality of conductive layers; and charge accumulating portions respectively provided between the semiconductor layer and the plurality of conductive layers.

DETAILED DESCRIPTION

Figure 1:
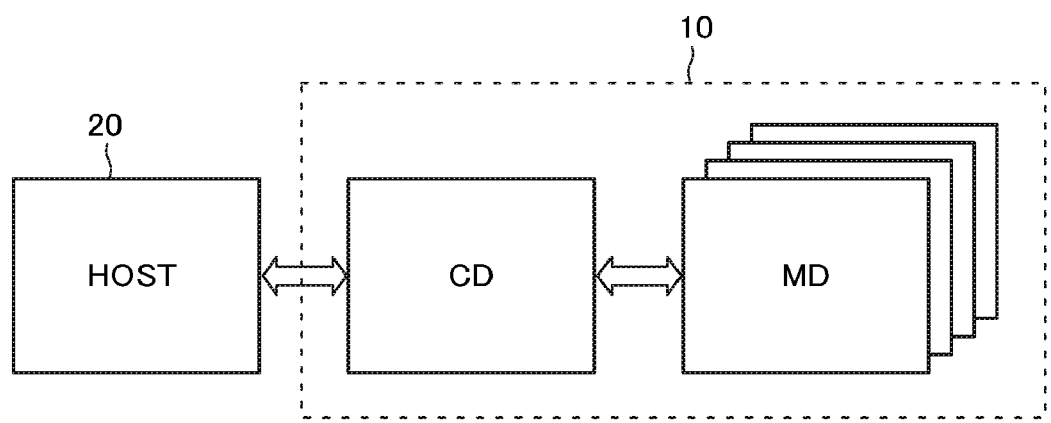
FIG. 1 is a schematic block diagram showing a configuration example of a semiconductor memory device according to a first embodiment.

A semiconductor memory device according to an embodiment comprises: a plurality of first conductive layers arranged separated from each other in a first direction; a plurality of second conductive layers arranged separated from each other in the first direction, the plurality of second conductive layers being arranged, electrically insulated from the plurality of first conductive layers, at a different position in a second direction intersecting the first direction with respect to the plurality of first conductive layers; a plurality of memory structures; and a source structure. The memory structures each comprise a first semiconductor layer extending in the first direction and facing the plurality of first conductive layers, and a first insulating film provided between the first semiconductor layer and the plurality of first conductive layers. A plurality of memory cells are formed at positions where the plurality of first conductive layers and the first semiconductor layer face each other, and the plurality of memory cells are serially connected in the first direction to configure a memory string. The source structure comprises a second semiconductor layer extending in the first direction and facing the plurality of second conductive layers, and a second insulating film provided between the second semiconductor layer and the plurality of second conductive layers. A plurality of transistors are formed at positions where the plurality of second conductive layers and the second semiconductor layer face each other, and the plurality of transistors are serially connected in the first direction. Respective one ends of the plurality of memory structures and one end of the source structure are electrically connected. The respective other ends of the plurality of memory structures are respectively electrically connected to first wirings that differ from each other, of a plurality of first wirings formed in a same layer in the first direction. The other end of the source structure is electrically connected to a second wiring formed in a different layer from the plurality of first wirings in the first direction.

Next, semiconductor memory devices according to embodiments will be described in detail with reference to the drawings. Note that the following embodiments are merely examples, and are not shown with the intention of limiting the present invention. Moreover, the following drawings are schematic, and, for convenience of description, some configurations, and so on, thereof will sometimes be omitted. Moreover, portions that are common to a plurality of drawings will be assigned with the same symbols, and descriptions thereof will sometimes be omitted.

Moreover, in the present specification, a certain direction parallel to a surface of a substrate will be called an X direction, a direction parallel to the surface of the substrate and perpendicular to the X direction will be called a Y direction, and a direction perpendicular to the surface of the substrate will be called a Z direction. Moreover, in the present specification, expressions such as "up" or "down" will be defined with reference to the substrate. For example, an orientation of moving away from the substrate along the Z direction will be called up, and an orientation of coming closer to the substrate along the Z direction will be called down. Moreover, when a lower surface or a lower end is referred to for a certain configuration, this will be assumed to mean a surface or end portion on a substrate side of this configuration, and when an upper surface or an upper end is referred to for a certain configuration, this will be assumed to mean a surface or end portion on an opposite side to the substrate of this configuration.

Moreover, in the present specification, "semiconductor memory device" has a variety of meanings, such as a memory die, a memory system including a control die of the likes of a memory chip, a memory card, and an SSD, and a configuration including a host computer of the likes of a smartphone, a tablet terminal, and a personal computer, and so on.

Moreover, in the present specification, a first configuration being "electrically connected" to a second configuration refers to the first configuration being connected directly, or being connected via a circuit such as a wiring, a semiconductor member, or a transistor, to the second configuration. For example, in the case of three transistors having been serially connected, the first transistor is "electrically connected" to the third transistor, even if the second transistor is in an OFF state.

First Embodiment

[Configuration]

A configuration of a semiconductor memory device according to a first embodiment will be described below with reference to the drawings.

[Configuration of Memory System]

FIG. 1 is a schematic block diagram showing a configuration example of the semiconductor memory device according to the first embodiment.

A memory system 10 performs read, write, erase, and so on, of user data, in response to a signal transmitted from a host computer 20. The memory system 10 is a memory chip, a memory card, an SSD, or another system capable of storing user data, for example. The memory system 10 comprises: a plurality of memory dies MD storing user data; and a control die CD connected to these plurality of memory dies MD and the host computer 20. The control die CD comprises the likes of a processor and a RAM, for example, and performs processing, such as conversion of a logical address and a physical address, bit error detection/correction, garbage collection (compaction), and wear leveling.

[Configuration of Memory Die]

Figure 2:
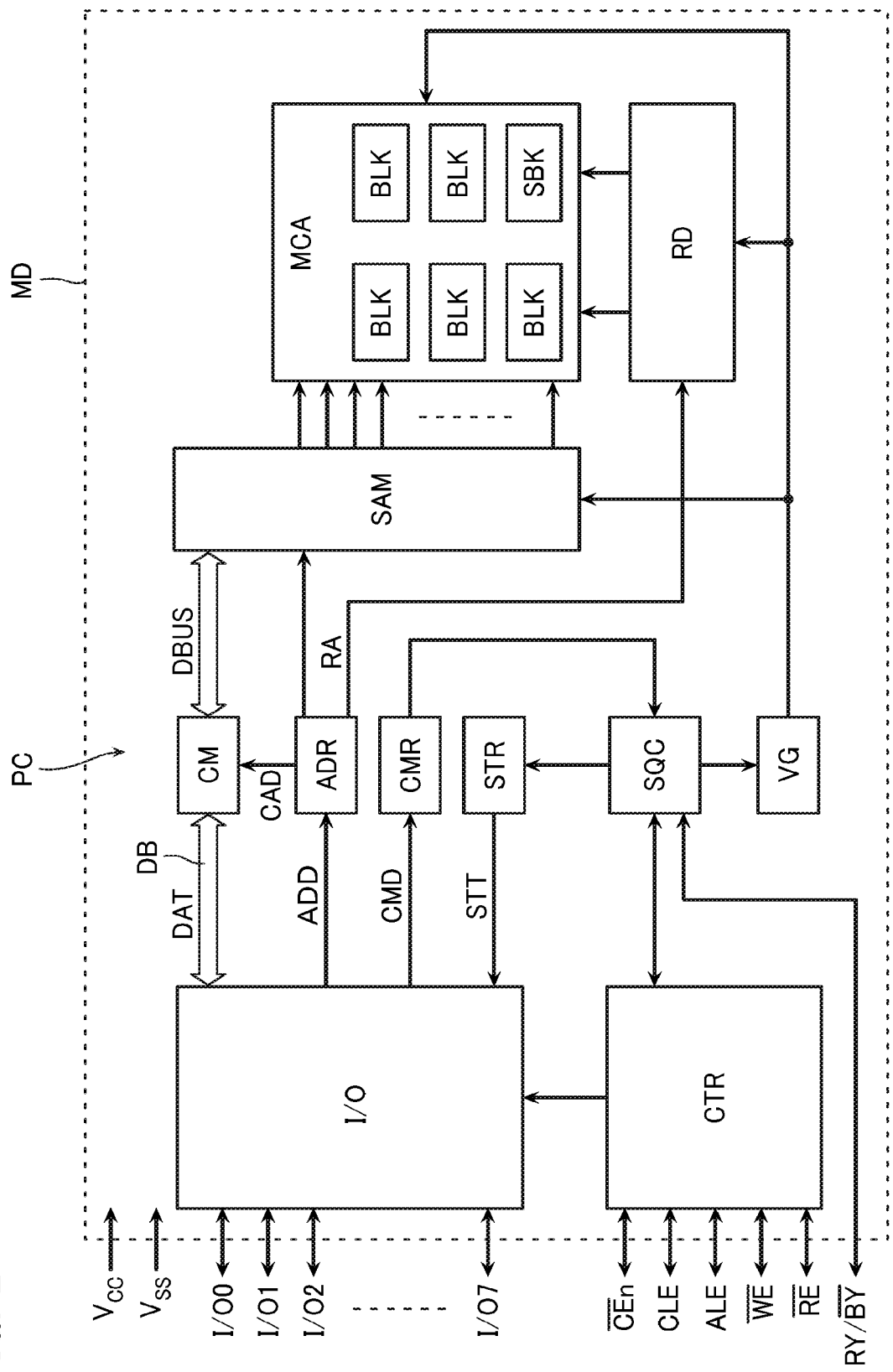
FIG. 2 is a schematic block diagram showing a configuration example of same semiconductor memory device.

FIG. 2 is a schematic block diagram showing a configuration example of the memory die MD in the semiconductor memory device according to the present embodiment.

As shown in FIG. 2, the memory die MD comprises: a memory cell array MCA that stores data; and a peripheral circuit PC connected to the memory cell array MCA. The peripheral circuit PC comprises a voltage generating circuit VG, a row decoder RD, a sense amplifier module SAM, and a sequencer SQC. In addition, the peripheral circuit PC comprises a cache memory CM, an address register ADR, a command register CMR, and a status register STR. In addition, the peripheral circuit PC comprises an input/output control circuit I/O and a logic circuit CTR.

The voltage generating circuit VG comprises a booster circuit such as a charge pump circuit connected to power supply terminals Vcc, Vss, a step-down circuit such as a regulator, and an unillustrated plurality of voltage supply lines. The voltage generating circuit VG generates and simultaneously outputs from the plurality of voltage supply lines a plurality of types of operation voltages to be applied to bit lines BL, a source line SL, word lines WL, and select gate lines (SGD, SGS) during a read operation, a write operation, and an erase operation on the memory cell array MCA, in accordance with an internal control signal from the sequencer SQC.

The row decoder RD comprises a decode circuit and a switch circuit, for example. The decode circuit decodes a row address RA held in the address register ADR. The switch circuit causes the word lines WL and the select gate lines (SGD, SGS) corresponding to the row address RA to be electrically connected with corresponding ones of the voltage supply lines, in response to an output signal of the decode circuit.

The sense amplifier module SAM comprises a plurality of sense amplifier circuits, a plurality of voltage adjusting circuits, and a plurality of data latches, that correspond to a plurality of the bit lines BL. The sense amplifier circuit latches in the data latch data of "H" or "L" indicating ON/OFF of a memory cell MC, in response to a current or voltage of the bit line BL. The voltage adjusting circuit causes the bit line BL to be electrically connected with a corresponding one of the voltage supply lines, in response to the data latched in the data latch.

In addition, the sense amplifier module SAM comprises an unillustrated decode circuit and an unillustrated switch circuit. The decode circuit decodes a column address CAD held in the address register ADR. The switch circuit causes the data latch corresponding to the column address CAD to be electrically connected with a bus DB, in response to an output signal of the decode circuit.

The sequencer SQC sequentially decodes command data CMD held in the command register CMR, and outputs internal control signals to the row decoder RD, the sense amplifier module SAM, and the voltage generating circuit VG. In addition, the sequencer SQC appropriately outputs to the status register STR status data STT indicating a state of the sequencer SQC itself, and delivers/receives to/from the control die CD a take-in possibility state of an external control signal in the memory die MD, via a terminal RY (/BY).

The input/output control circuit I/O comprises: data input/output terminals I/O0-I/O7; a shift register connected to these data input/output terminals I/O0-I/O7; and a buffer memory connected to this shift register.

The buffer memory outputs data to the data latch in the sense amplifier module SAM, to the address register ADR, or to the command register CMR, in response to an internal control signal from the logic circuit CTR. In addition, the buffer memory is inputted with data from the data latch or the status register STR, in response to an internal control signal from the logic circuit CTR. Note that the buffer memory may be realized by part of the above-described shift register, or may be realized by a configuration such as an SRAM.

The logic circuit CTR receives an external control signal from the control die CD via external control terminals /CEn, CLE, ALE, /WE, /RE, and outputs an internal control signal to the input/output control circuit I/O depending on this external control signal.

Figure 3:
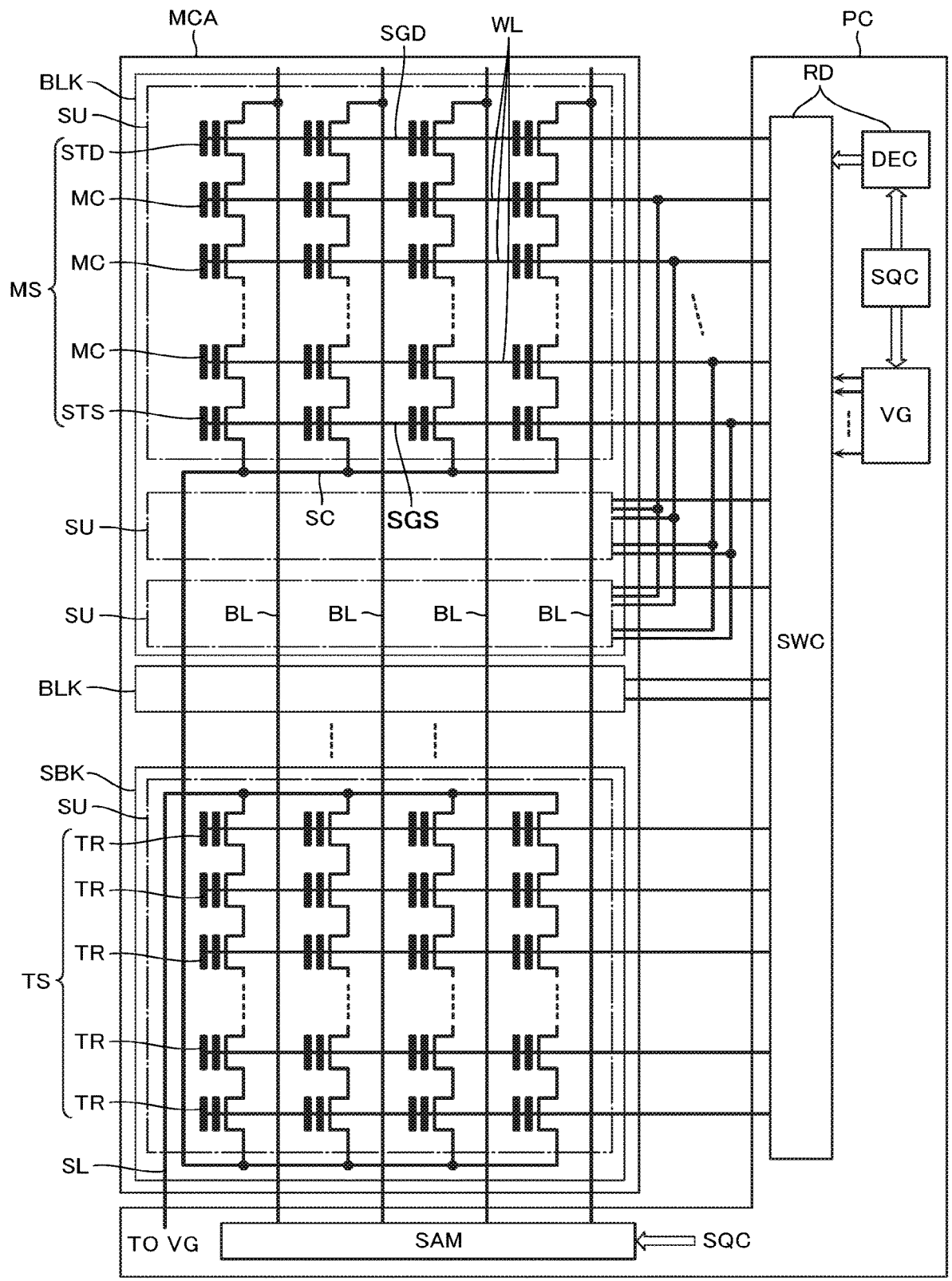
FIG. 3 is an equivalent circuit diagram showing a schematic configuration of same semiconductor memory device.

FIG. 3 is a schematic equivalent circuit diagram showing in more detail the memory cell array MCA of FIG. 2 and part of its peripheral circuit PC.

The memory cell array MCA comprises: a plurality of memory blocks BLK; and one or a plurality of source blocks SBK. The plurality of memory blocks BLK each comprise a plurality of string units SU. These plurality of string units SU each comprise a plurality of memory strings MS. One ends of these plurality of memory strings MS are respectively connected to the peripheral circuit PC via the bit lines BL. Moreover, the other ends of these plurality of memory strings MS are each connected to the peripheral circuit PC via a common source line SC, the source block BLK, and the source line SL.

The source block SBK is basically configured similarly to the memory block BLK, but, unlike the memory block BLK, functions as a source line. Therefore, the source block SBK is not connected to the bit line BL, but, instead, is connected to the source line SL. That is, the source block SBK comprises one or a plurality of the string units SU. The string unit SU comprises a plurality of transistor strings TS. One ends of these plurality of transistor strings TS are each connected to the peripheral circuit PC via the source line SL. Moreover, the other ends of these plurality of transistor strings TS are each connected to the memory block BLK and the common source line SC.

The memory string MS comprises a drain select transistor STD, a plurality of the memory cells MC, and a source select transistor STS, that are connected in series between the bit line BL and the source line SC. Hereafter, the drain select transistor STD and the source select transistor STS will sometimes simply be called select transistors (STD, STS), or the like.

The memory cell MC is a field effect type of transistor (a memory transistor) that comprises: a semiconductor layer functioning as a channel region; a gate insulating film including a charge accumulating film; and a gate electrode. A threshold voltage of the memory cell MC changes according to an amount of charge in the charge accumulating film. Note that the gate electrodes of the plurality of memory cells MC corresponding to one memory string MS are respectively connected to the word lines WL. These word lines WL are respectively commonly connected to all the memory strings MS in one memory block BLK.

The select transistor (STD, STS) is a field effect type of transistor that comprises: a semiconductor layer functioning as a channel region; a gate insulating film; and a gate electrode. The gate electrodes of the select transistors (STD, STS) are respectively connected with the select gate lines (SGD, SGS). A drain select gate line SGD is provided correspondingly to the string unit SU and is commonly connected to all the memory strings MS in one string unit SU. A source select gate line SGS is commonly connected to all the memory strings MS in one memory block BLK.

The transistor string TS comprises a plurality of transistors TR that are connected in series between the source line SL and the common source line SC. The transistor TR is a field effect type of transistor that comprises: a semiconductor layer functioning as a channel region; a gate insulating film including a charge accumulating film; and a gate electrode. Although the transistor TR is capable of having its threshold voltage adjusted according to an amount of charge in its charge accumulating film, it is not used as a memory cell storing user data. Note that the gate electrodes of the plurality of transistors TR corresponding to one transistor string TS are respectively connected with signal lines similar to the word lines WL and select gate lines SGD, SGS of the memory block BLK. The signal line equivalent to the drain select gate line SGD, of these signal lines equivalent to the word lines WL and select gate lines SGD, SGS is provided correspondingly to the string unit SU and is commonly connected to all the transistor strings TS in one string unit SU. Moreover, the signal lines equivalent to the word lines WL and source select gate line SGS, of the signal lines equivalent to the word lines WL and select gate lines SGD, SGS are respectively commonly connected all the transistor strings TS in one source block SBK.

The row decoder RD of the peripheral circuit PC comprises a decode circuit DEC and a switch circuit SWC.

The decode circuit DEC sequentially makes reference to the row address RA of the address register ADR, and decodes this row address RA to supply the switch circuit SWC with a signal for selecting a certain memory block BLK corresponding to the row address RA and a voltage, in accordance with a control signal from the sequencer SQC.

The switch circuit SWC supplies to the word line WL and select gate line (SGD, SGS) of the memory block BLK and source block SBK selected by the decode circuit DEC the voltage selected by the decode circuit DEC and sequencer SQC.

Figure 4:
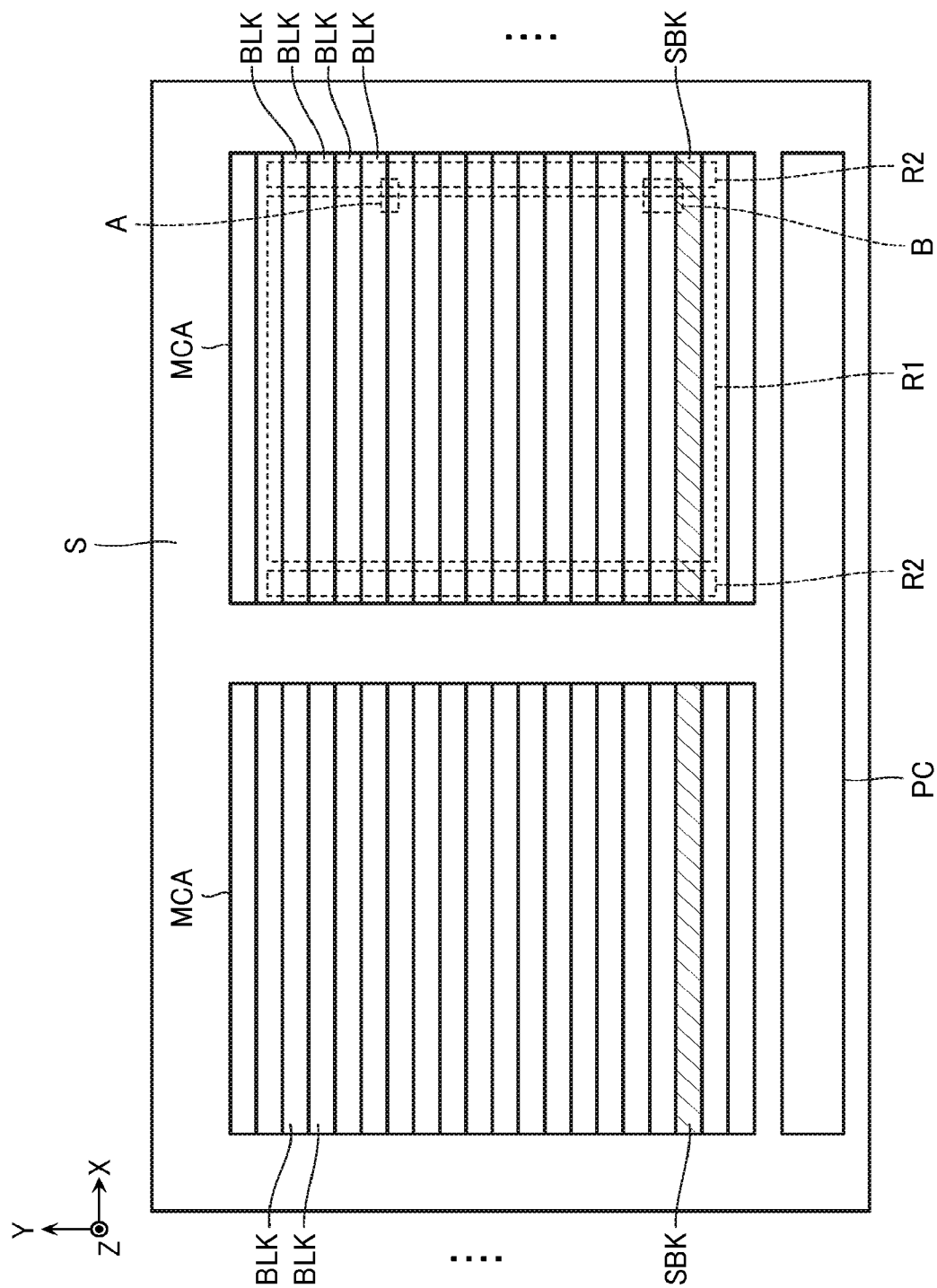
FIG. 4 is a schematic plan view of same semiconductor memory device.

FIG. 4 is a schematic plan view of the memory die MD. As shown in FIG. 4, the memory die MD comprises a plurality of the memory cell arrays MCA arranged on a semiconductor substrate S, for example. In this example, two memory cell arrays MCA are arranged in the X direction. The peripheral circuit PC is disposed in a position adjacent in the Y direction to the two memory cell arrays MCA.

The plurality of memory blocks BLK configuring each of the memory cell arrays MCA are arranged in the Y direction, for example. The source block SBK is disposed at a most endward position in the Y direction. In the memory cell array MCA further outside of the source block SBK in the Y direction, a dummy block may be disposed. Note that the position where the source block SBK is disposed may be any place other than this position, for example, a center portion in the Y direction, or may be provided, separated, in a plurality of places.

Each of the memory cell arrays MCA comprises: a region R1 where the memory cells MC and transistors TR are provided; and a region R2 formed in a step-like manner where the likes of contacts to the word lines WL and select gate lines (SGD, SGS) are connected. In this example, the region R2 is provided on both sides in the X direction of the region R1.

Figure 5:
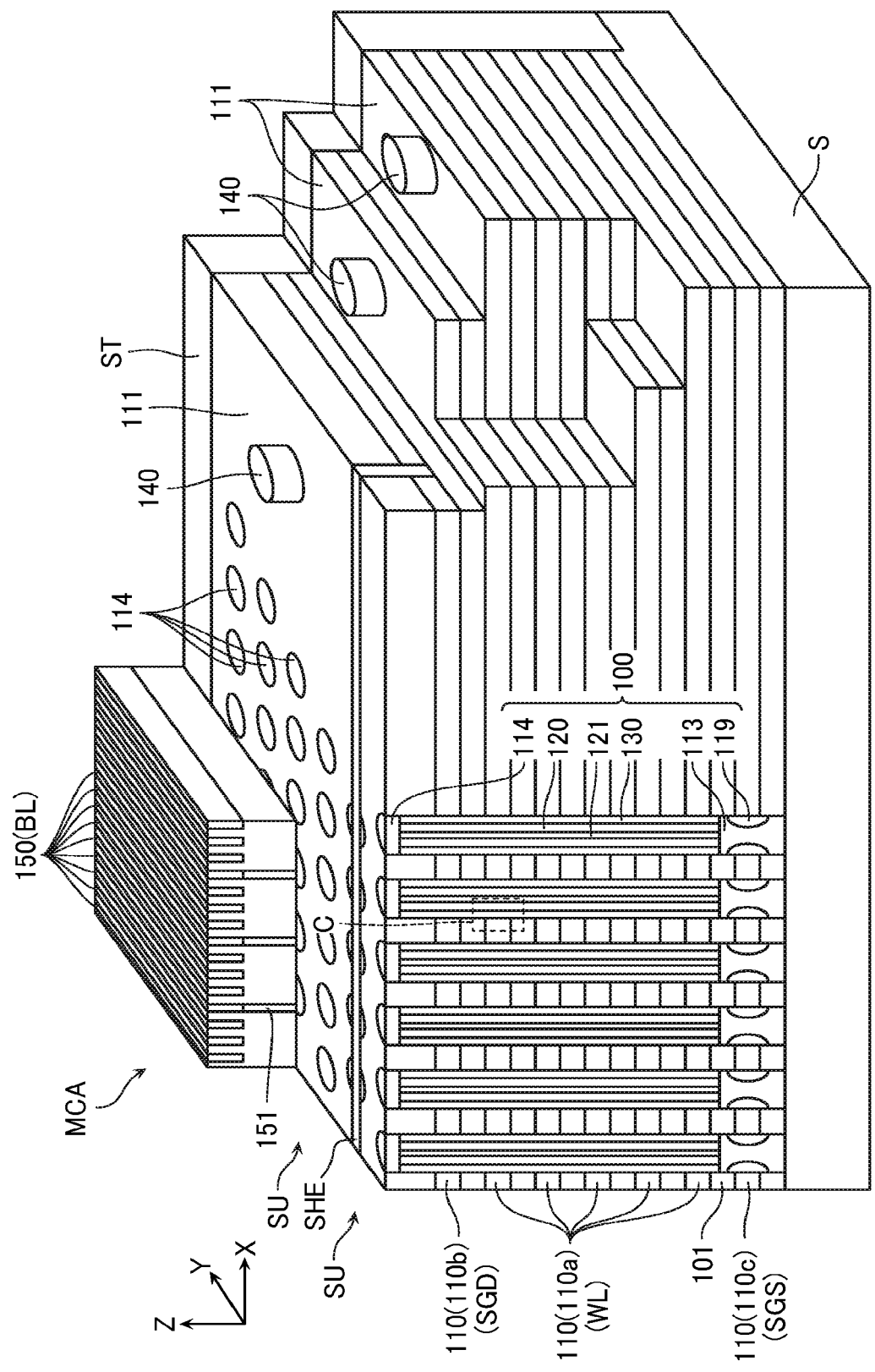
FIG. 5 is a schematic perspective view showing the portion A of FIG. 4.

FIG. 5 is a schematic perspective view of the portion indicated by A of FIG. 4. For convenience of explanation, some configurations are omitted in FIG. 5.

As shown in FIG. 5, the semiconductor memory device according to the present embodiment comprises: the substrate S; and the memory cell array MCA provided above the substrate S.

The substrate S is a semiconductor substrate configured from the likes of single crystal silicon (Si), for example. The substrate S comprises a double well structure in which an N type impurity layer of the likes of phosphorus (P) is included in a surface of the semiconductor substrate, and a P type impurity layer of the likes of boron (B) is further included in this N type impurity layer, for example. Moreover, in the present embodiment, the surface of the substrate S may be a wiring layer functioning as a lower wiring, or there may be provided above the substrate S a separate wiring layer.

The memory cell array MCA comprises: a plurality of memory structures 100, of circular columnar shape, for example, that extend in the Z direction; a plurality of plate-like conductive layers 110 extending in the XY directions, for example, that cover outer circumferential surfaces of these plurality of memory structures 100 in an XY cross section; contacts 140 which are connected to these plurality of conductive layers 110; and a plurality of wirings 150 connected to upper ends of the memory structures 100. Note that the memory structure 100 includes: a memory structure 100A to be mentioned later; and a source structure 100B, whose description will be omitted here, that has a structure equivalent to that of the memory structure 100A.

The memory structures 100 are arranged in a certain pattern in the X direction and the Y direction. These memory structures 100 basically function as the memory strings MS. The memory cells MC are provided at each of intersections of the memory structures 100 and the conductive layers 110.

The memory structure 100 comprises: a semiconductor layer 120 extending in the Z direction; a gate insulating film 130 provided between the semiconductor layer 120 and the conductive layers 110; a semiconductor layer 113 connected between a lower end of the semiconductor layer 120 and the surface of the substrate S; and a semiconductor layer 114 connected to an upper end of the semiconductor layer 120.

The semiconductor layer 120 functions as the channel regions of the plurality of memory cells MC and the drain select transistor STD included in one memory string MS (FIG. 3), for example. The semiconductor layer 120 has a substantially cylindrical shape, and has embedded in its center portion an insulating layer 121 of the likes of silicon oxide ($SiO_2$), for example. The semiconductor layer 120 includes a semiconductor such as non-doped polycrystalline silicon (Si), for example.

Figure 6:
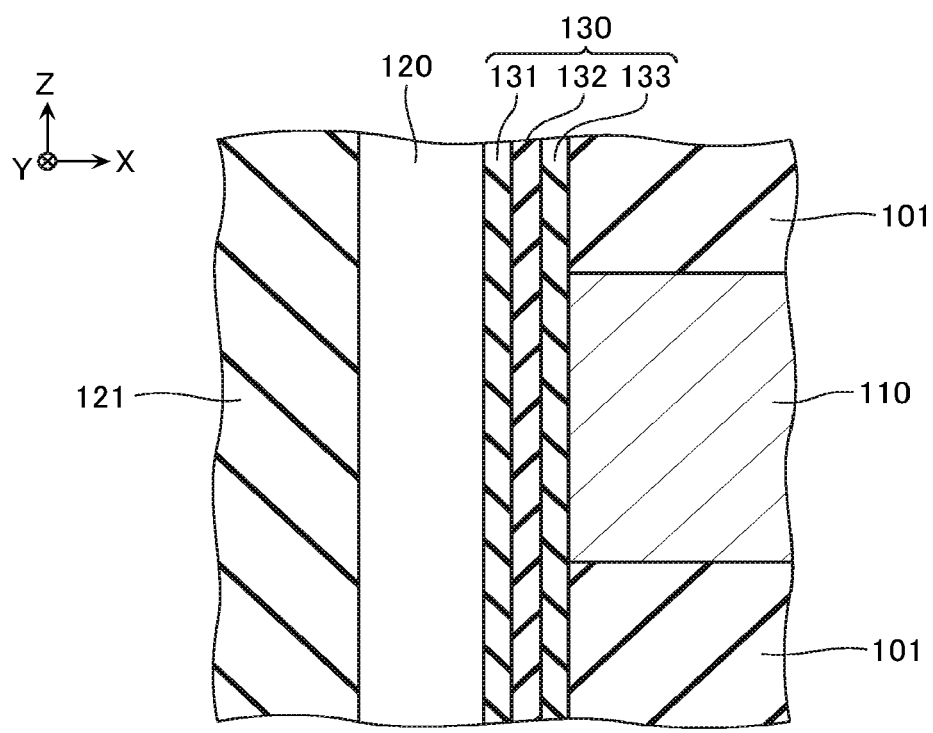
FIG. 6 is an enlarged view of the portion C of FIG. 5.

The gate insulating film 130 is provided having a substantially cylindrical shape on an outer circumferential surface of the semiconductor layer 120. FIG. 6 is a cross-sectional view enlarging the portion C of FIG. 5. The gate insulating film 130 comprises a tunnel insulating film 131, a charge accumulating film 132, and a block insulating film 133 that are laminated between the semiconductor layer 120 and the conductive layer 110. The tunnel insulating film 131 and the block insulating film 133 are insulating films of the likes of silicon oxide ($SiO_2$), for example. The charge accumulating film 132 is a film capable of accumulating a charge, of the likes of silicon nitride (SiN), for example. Note that although FIG. 6 shows a configuration on a cross section along the X direction (an XZ cross section) of part of the memory string MS, the memory string MS comprises a similar configuration even on a cross section along a principal plane direction of the substrate S other than the X direction.

Returning to FIG. 5, the semiconductor layer 113 functions as the channel region of the source select transistor STS, for example. A gate insulating film 119 is provided in an outer circumferential surface of the semiconductor layer 113. The semiconductor layer 113 includes a semiconductor such as single crystal silicon (Si), for example. The gate insulating film 119 is an insulating film of the likes of silicon oxide ($SiO_2$), for example.

The semiconductor layer 114 is a layer that includes an N type impurity such as phosphorus in a semiconductor such as polycrystalline silicon (Si), for example.

A plurality of the conductive layers 110 are arranged in the Z direction via insulating layers 101 of the likes of silicon oxide ($SiO_2$), and each of the conductive layers 110 has a substantially plate-like shape extending in the X direction and the Y direction. These conductive layers 110 include a plurality of through-holes formed in a certain pattern, and insides of these through-holes are respectively provided with the memory structures 100. In addition, an end portion in the X direction of the conductive layer 110 is provided with a contact portion 111 connected to the contact 140. Because the conductive layer 110 configures the memory block BLK and the source block SBK, it is divided in the Y direction by an insulating portion ST of the likes of silicon oxide extending to the substrate S in the X direction and the Z direction. The conductive layer 110 includes the likes of a laminated film of titanium nitride (TiN) and tungsten (W), for example.

Some of the conductive layers 110, namely, conductive layers 110a function as the word lines WL (FIG. 3) and as the gate electrodes of the plurality of memory cells MC (FIG. 3) connected to these word lines WL.

The conductive layer 110 provided above these conductive layers 110a, namely a conductive layer 110b functions as the drain select gate line SGD (FIG. 3) and as the gate electrode of the drain select transistor STD (FIG. 3) connected to this drain select gate line SGD. The conductive layer 110b, of the conductive layers 110 divided by the insulating portion ST, is further divided in the Y direction by an insulating portion SHE of the likes of silicon oxide extending in the X direction and the Z direction. That is, the conductive layer 110b has a smaller width in the Y direction than the conductive layer 110a.

The conductive layer 110 provided below the conductive layers 110a, namely, a conductive layer 110c functions as the source select gate line SGS (FIG. 3) and as the gate electrodes of the plurality of source select transistors STS (FIG. 3) connected to this source select gate line SGS. The conductive layer 110c covers the outer circumferential surface of the semiconductor layer 113 via the gate insulating film 119.

The contacts 140 extend in the Z direction, and are connected to the contact portions 111 of the plurality of conductive layers 110. The contact 140 includes the likes of a laminated film of titanium nitride (TiN) and tungsten (W), for example.

The wiring 150 functions as the bit line BL. A plurality of the wirings 150 are arranged in the X direction, and each of the wirings 150 extends in the Y direction. The wirings 150 are electrically connected to the plurality of memory structures 100, via contacts 151.

Figure 7:
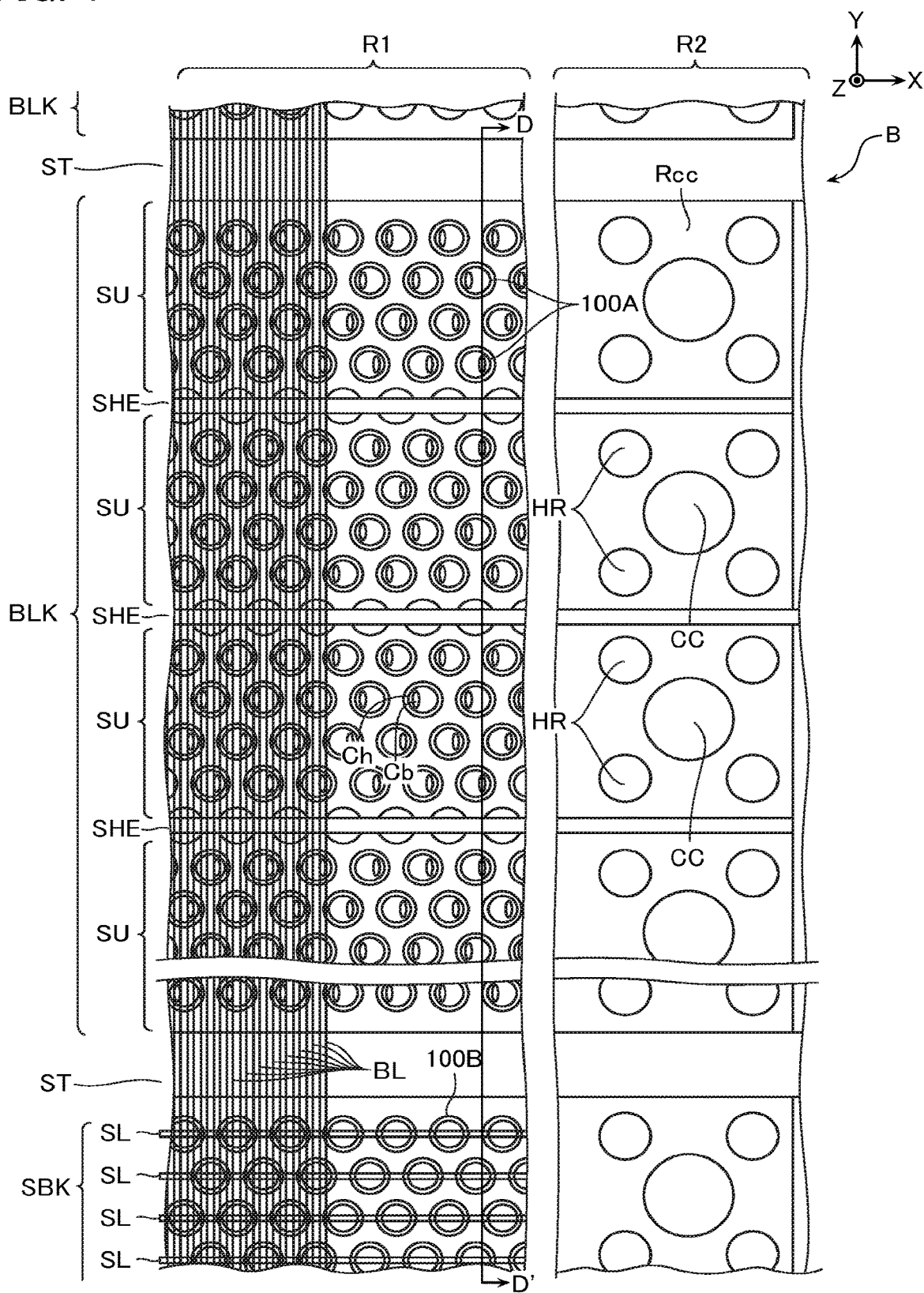
FIG. 7 is an enlarged view of the portion B of FIG. 4.

FIG. 7 is a schematic plan view of the portion indicated by B of FIG. 4. Moreover, FIG. 8 is a schematic cross-sectional view in which the structure shown in FIG. 7 is sectioned along the line D-D' and looked at in the direction of the arrows.

Figure 8:
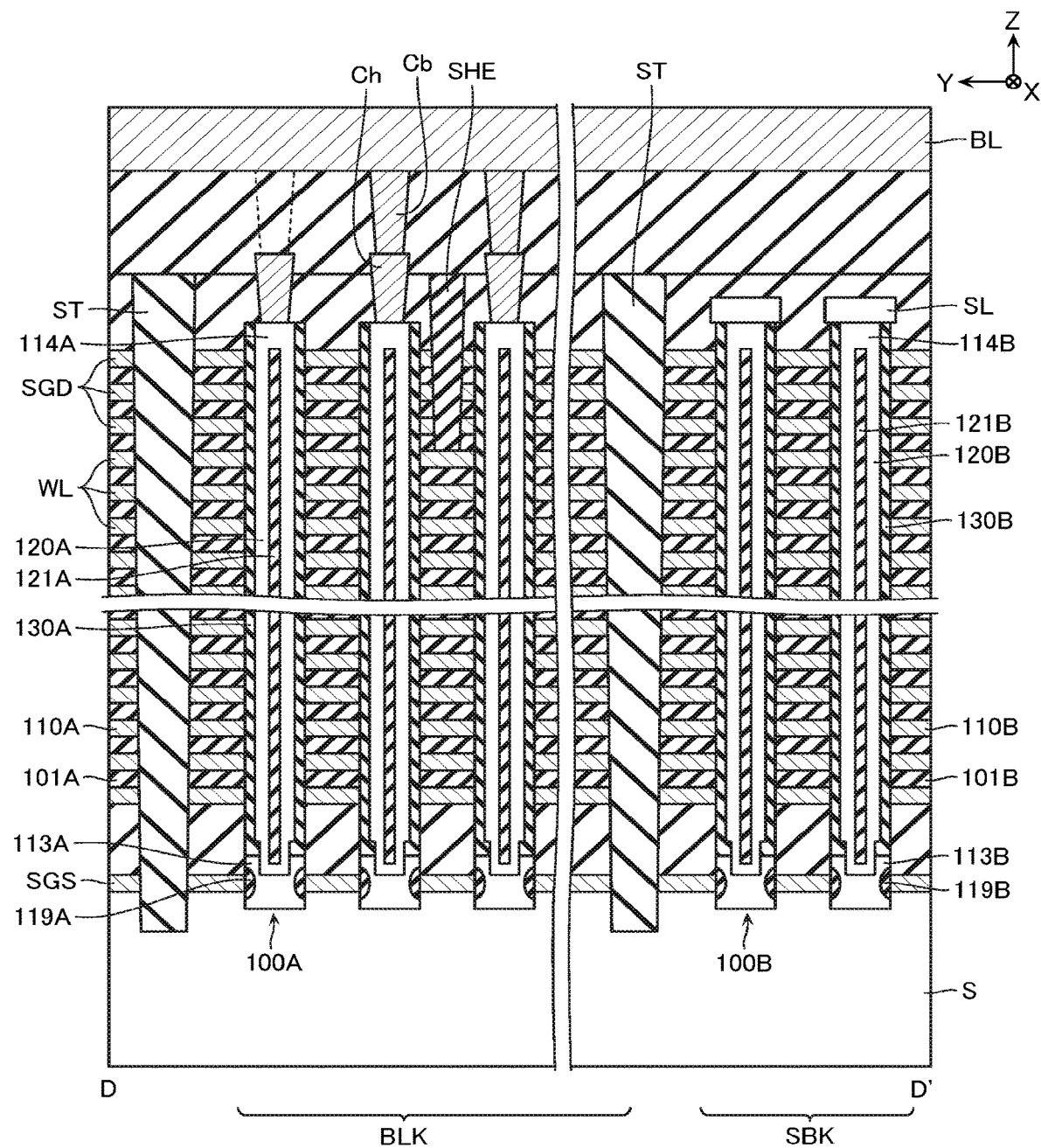
FIG. 8 is a schematic cross-sectional view in which the structure of FIG. 7 is sectioned along the line D-D' and looked at in the direction of the arrows.

In FIGS. 7 and 8, the insulating portion ST extending in the X direction and the Z direction is provided between two memory blocks BLK (a first memory block and a second memory block) adjacent in the Y direction and between the memory block BLK and the source block SBK. The insulating portion ST extends to the substrate S in the Z direction, and divides between the memory blocks BLK and between the memory block BLK and the source block SBK in the Y direction. Moreover, one memory block BLK includes a plurality of the string units SU in the Y direction. The insulating portion SHE extending in the X direction and the Z direction is provided between two string units SU adjacent in the Y direction. The insulating portion SHE divides only the drain select gate line SGD, of the plurality of conductive layers 110. Note that the source block SBK may include a plurality of the string units SU, or may be configured by one string unit SU.

As shown in FIG. 8, the memory block BLK comprises the following in the region R1, namely: a plurality of the memory structures 100A that extend in the Z direction and are disposed in a zigzag manner in the XY directions; a plurality of first conductive layers 110A arranged in the Z direction and covering outer circumferential surfaces of these plurality of memory structures 100A in an XY cross section; a plurality of first insulating layers 101A disposed between the plurality of first conductive layers 110A; and a plurality of the bit lines BL electrically connected via contacts Cb, Ch, to upper ends of the memory structures 100A. As shown in FIG. 8, the memory structure 100A includes: a first semiconductor layer 120A extending in the Z direction; first semiconductor layers 114A, 113A above and below the first semiconductor layer 120A; a first gate insulating film 130A provided between the first semiconductor layer 120A and the first conductive layers 110A; and a first insulating layer 121A embedded in a center portion of the memory structure 100A. As shown in FIG. 7, the memory block BLK includes a contact region Rcc in the region R2. The contact region Rcc is provided in an end portion formed in a step-like manner, of the first conductive layer 110A, and has disposed therein a contact CC and a support structure HR.

As shown in FIG. 8, the source block SBK comprises: a plurality of the source structures 100B extending in the Z direction; a plurality of second conductive layers 110B arranged in the Z direction and covering outer circumferential surfaces of these plurality of source structures 100B in an XY cross section; a plurality of second insulating layers 101B disposed between the plurality of second conductive layers 110B; and a plurality of the source lines SL electrically connected to upper ends of the source structures 100B. The source structure 100B is configured similarly to the memory structure 100A. That is, as shown in FIG. 8, the source structure 100B includes: a second semiconductor layer 120B extending in the Z direction; second semiconductor layers 114B, 113B above and below the second semiconductor layer 120B; a second gate insulating film 130B provided between the second semiconductor layer 120B and the second conductive layers 110B; and a second insulating layer 121B embedded in a center portion of the source structure 100B. The second gate insulating film 130B has a laminated structure of the kind shown in FIG. 6, for example. The second conductive layer 110B is configured similarly to the first conductive layer 110A. As shown in FIG. 7, the source block SBK includes the contact region Rcc in the region R2. The contact region Rcc is provided in an end portion formed in a step-like manner, of the second conductive layer 110B, and has disposed therein the contact CC and the support structure HR. Moreover, as shown in FIG. 7, the memory structure 100A and the source structure 100B are disposed with substantially the same pitch as each other in the region R1.

A lower end portion of the memory structure 100A and a lower end portion of the source structure 100B are electrically connected via the substrate S. The first conductive layer 110A and the second conductive layer 110B are electrically insulated from each other by the insulating portion ST. The bit line BL extends in the Y direction, and the source line SL extends in the X direction. A distance between the source line SL and an upper end of the source structure 100B is smaller than a distance between the bit line BL and an upper end of the memory structure 100A. In other words, the source line SL is arranged more downwardly than the bit line BL is. Therefore, the bit line BL and the source line SL do not interfere with each other.

[Operation]

Next, operation of the semiconductor memory device configured in this way will be described.

In the semiconductor memory device of the present embodiment, the source block SBK functions as the source line of the memory block BLK. In the present embodiment, in order for the source block SBK to be made to function as the source line, the transistors TR configuring some or all of the transistor strings TS of the source block SBK shown in FIG. 3 are set to an ON state. As a result, the substrate S and the source line SL are electrically continuous via the transistor string TS configuring the source block SBK. In the present embodiment, as shown in FIG. 7, the upper ends of the plurality of source structures 100B arranged in the X direction are commonly connected to the source line SL. Furthermore, the plurality of source lines SL arranged in the Y direction may be commonly connected. Moreover, the upper ends of all the source structures 100B configuring the source block SBK may be connected to a common source line SL. The larger the number of source structures 100B commonly connected in this way is, the smaller a conductive resistance can be made. Moreover, even in the case where some of the source structures 100B have not attained a state of electrical continuity, function as the source line is hardly affected.

Specific operation of the semiconductor memory device according to the present embodiment will be described below.

[Erase Operation of Memory Block BLK]

Figure 9:
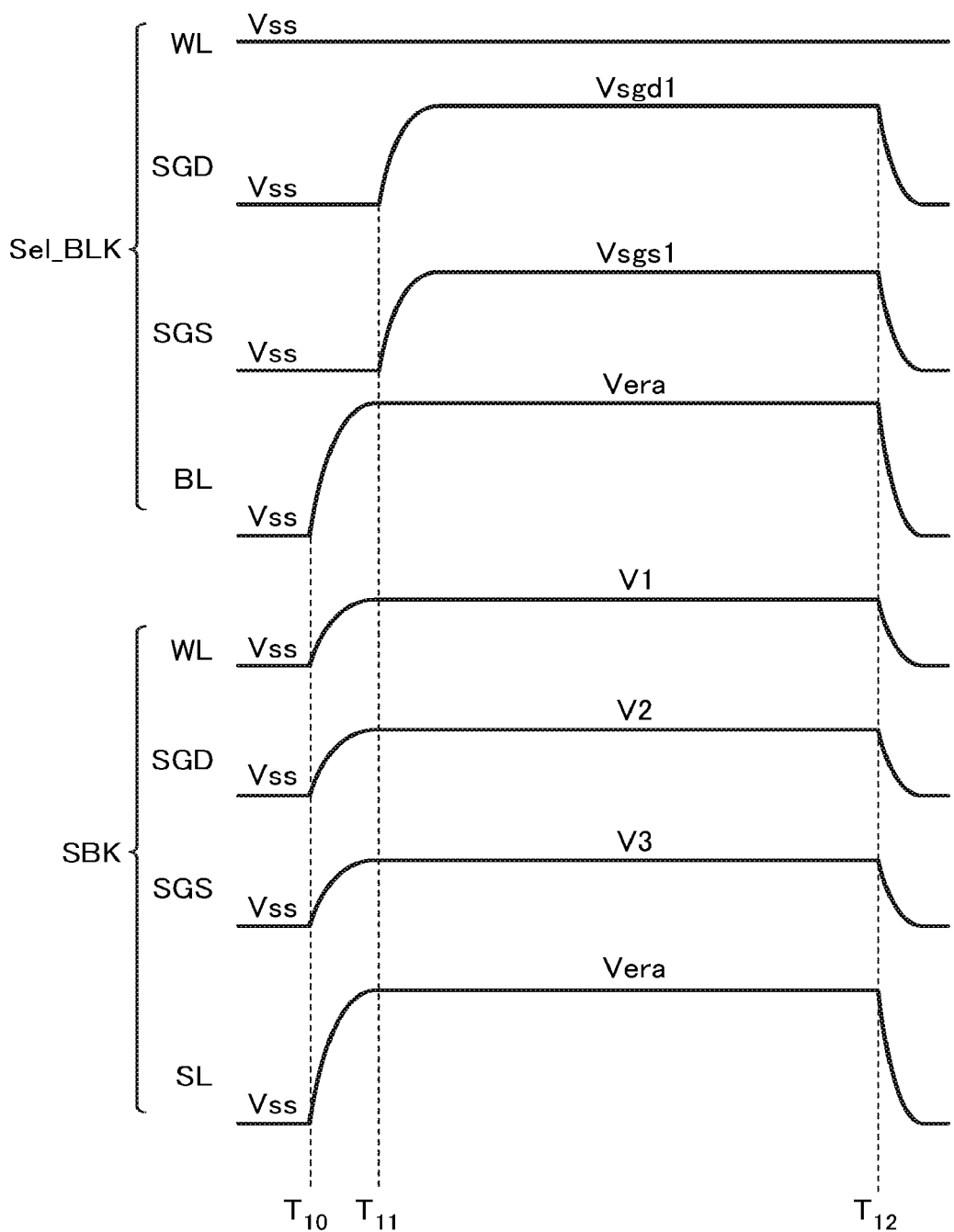
FIG. 9 is a waveform diagram showing applied voltages of each of portions during an erase operation of a memory block of same semiconductor memory device.

FIG. 9 is a waveform diagram showing voltages applied to each of portions when erasing simultaneously (flash erasing) a selected memory block Sel_BLK.

At time T10, the bit lines BL of the selected memory block Sel_BLK to be erased, and the source line SL of the source block SBK, are applied with an erase voltage Vera. The word lines WL of the selected memory block Sel_BLK are applied with the voltage Vss or a voltage lower than the voltage Vss. In addition, the word lines WL and the select gate lines SGD, SGS of the source block SBK are respectively with voltages V1, V2, V3 at which the transistors TR attain an ON state. As a result, all the transistors TR of the source block SBK attain an ON state, and the erase voltage Vera is applied to the substrate S directly under the selected memory block Sel_BLK. Note that as for a voltage value to be applied to the word lines WL and the select gate lines SGD, SGS of the source block BLK, there is no particular limitation thereon provided that the voltage applied to the source line SL is able to be supplied to the substrate S via each of the transistors TR of the source block SBK in each of operations, and, for example, the voltage Vss may be applied during any operation.

At following time T11, the select gate lines SGD, SGS of the selected memory block Sel_BLK are respectively applied with voltages Vsgd1, Vsgs1. The voltage Vsgd1 is a voltage of a degree at which a GIDL (Gate Induced Drain Leakage) current occurs in the select transistor STD. The voltage Vsgs1 is a voltage at which the select transistor STS is switched ON. Thus, a channel formed in the first semiconductor layer 120A has holes generated therein due to the GIDL current, from a bit line BL side, and is injected with holes from a substrate S side, whereby a voltage of the channel rises to Vera. As a result, holes are injected via the tunnel insulating film 131 into the charge accumulating film 132 facing all the word lines WL.

At time T12, all the voltages are set to Vss. By the above operation being repeated until erase verify is passed, all the memory cells MC of the selected memory block Sel_BLK are erased simultaneously. Note that a configuration may be adopted whereby holes are caused to be generated in the first semiconductor layer 120A due to the GIDL current from the substrate S side too.

[Write Operation]

Figure 10:
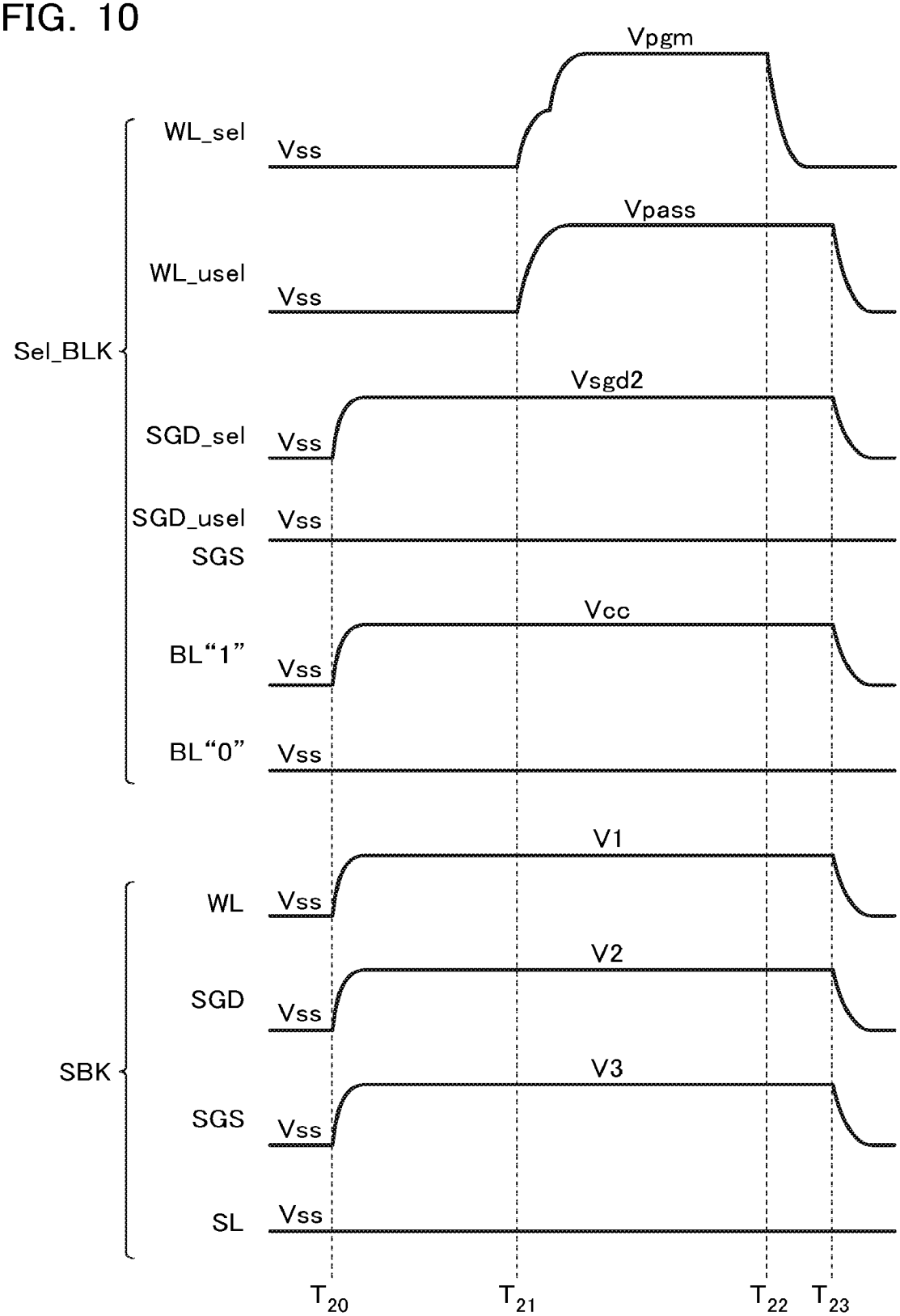
FIG. 10 is a waveform diagram showing applied voltages of each of portions during a data write operation of a memory block of same semiconductor memory device.

FIG. 10 is a waveform diagram showing voltages applied to each of portions when writing data to the memory cell MC of a selected memory block Sel_BLK.

At time T20, the select gate line SGD_sel selecting the string unit SU to be written with data of the selected memory block Sel_BLK is applied with a voltage Vsgd2 that sets the select transistor STD to ON. The other select gate lines SGD_usel, SGS are applied with the voltage Vss. The bit line BL connected to the memory string MS to be written with data "1", of a page to be written with data is applied with the voltage Vcc, and the bit line BL connected to the memory string MS to be written with data "0", of the page to be written with data is applied with the voltage Vss. In addition, the source line SL is applied with the voltage Vss, and the word lines WL and the select gate lines SGD, SGS of the source block SBK are respectively applied with the voltages V1, V2, V3 at which the transistors TR attain an ON state. As a result, all the transistors TR of the source block SBK attain an ON state, and the voltage Vss is applied to the substrate S directly under the selected memory block Sel_BLK.

At following time T21, a selected word line WL_sel and unselected word lines WL_usel are applied with a pass voltage Vpass, after which a voltage of the selected word line WL_sel is raised to a program voltage Vpgm which is larger than the pass voltage Vpass. As a result, the memory cell MC for which a voltage of the bit line BL is Vss has electrons injected into its charge accumulating film 132 from a channel side, and thereby undergoes write of data. On the other hand, the memory cell MC for which a voltage of the bit line BL is Vcc has its channel boosted due to the select transistors STD, STS being in an OFF state, and thereby does not undergo write of data.

At time T22, the voltage of the selected word line WL_sel is lowered to Vss, and at time T23, all the voltages are lowered to Vss. By the above operation being repeated until program verify is passed, data is written to the memory cell MC of the selected memory block Sel_BLK.

[Read Operation]

Figure 11:
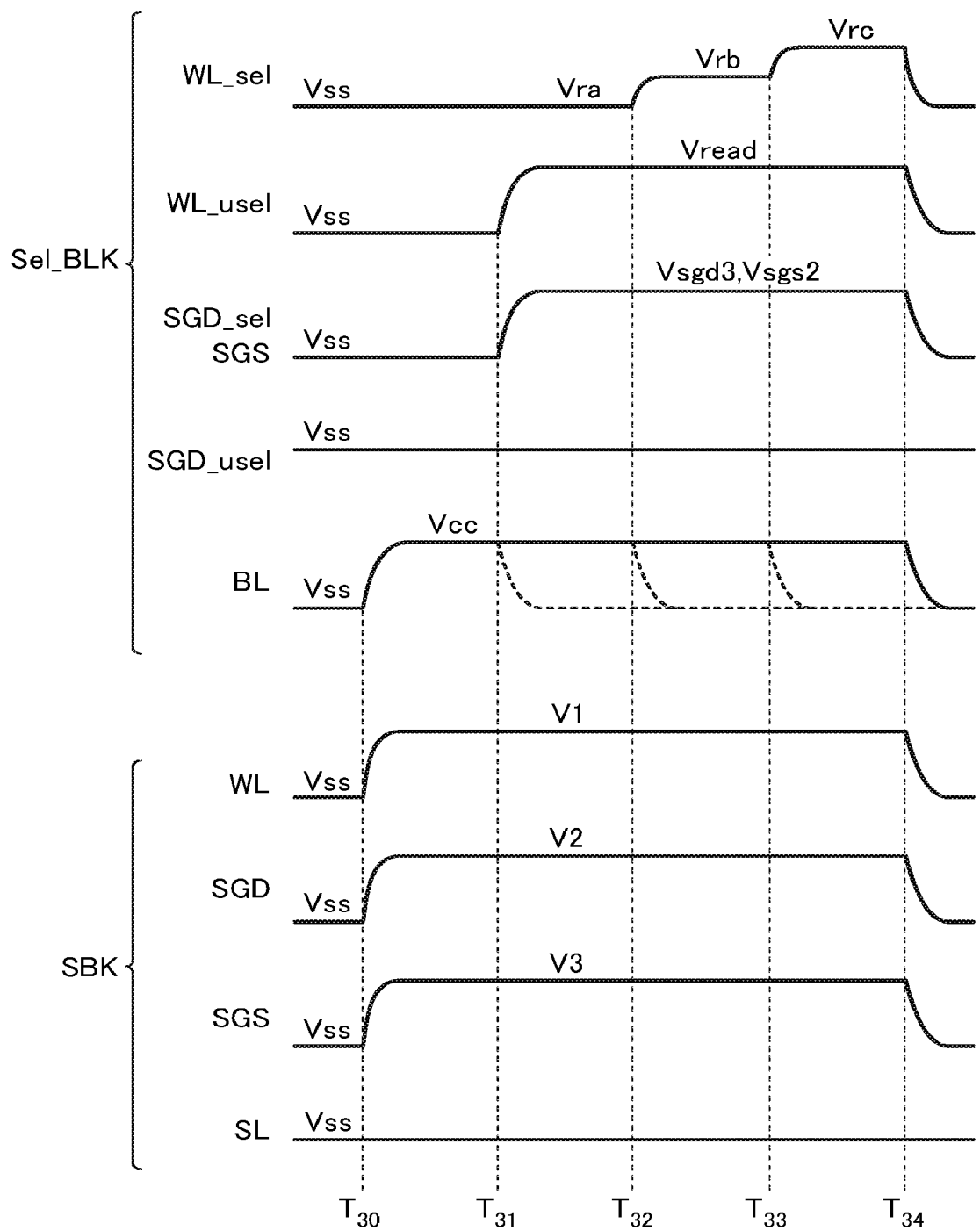
FIG. 11 is a waveform diagram showing applied voltages of each of portions during a data read operation of a memory block of same semiconductor memory device.

FIG. 11 is a waveform diagram showing voltages applied to each of portions when reading data from the memory cell MC of a selected memory block Sel_BLK. Note that although an example of read of MLC (Multi-Level Cell) data is shown below, the same is conceivable also for read of SLC (Single-Level Cell) data or of another multi-level data.

At time T30, the bit lines BL are applied with the voltage Vcc. In addition, the source line SL is applied with the voltage Vss, and the word lines WL and the select gate lines SGD, SGS of the source block SBK are respectively applied with the voltages V1, V2, V3 at which the transistors TR attain an ON state. As a result, all the transistors TR of the source block SBK attain an ON state, and the voltage Vss is applied to the substrate S directly under the selected memory block Sel_BLK.

At following time T31, the select gate line SGD_sel selecting the string unit SU whose data is to be read, and the select gate line SGS, of the selected memory block Sel_BLK are respectively applied with voltages Vsgd3, Vsgs2 that set the select transistors STD, STS to ON. The other select gate lines SGD_usel are applied with the voltage Vss. Moreover, a selected word line WL_sel is applied with a read voltage Vra, and unselected word lines WL_usel are applied with a voltage Vread at which the memory cells MC connected to the unselected word lines WL_usel attain an ON state. At this time, if a threshold level of the memory cell MC to be read is no more than the read voltage Vra, then a current flows from the bit line BL to the source line SL via the memory string MS of the selected memory block Sel_BLK, the substrate S, and the transistor string TS of the source block SBK, and therefore voltage of the bit line BL falls to Vss. As a result, read data is determined to be Er (erase level).

At time T32, the selected word line WL_sel is applied with a read voltage Vrb (>Vra). At this time, if the threshold level of the memory cell MC to be read is larger than the read voltage Vra but no more than the read voltage Vrb, then current flows along a similar path to that described above, and therefore voltage of the bit line BL falls to Vss. As a result, read data is determined to be A level.

At time T33, the selected word line WL_sel is applied with a read voltage Vrc (>Vrb). At this time, if the threshold level of the memory cell MC to be read is larger than the read voltage Vrb but no more than the read voltage Vrc, then current flows along a similar path to that described above, and therefore voltage of the bit line BL falls to Vss. As a result, read data is determined to be B level. Moreover, in the case where the voltage of the bit line BL is maintained at Vcc at this time, the read data is determined to be C level. After going through the above processing, all voltages are lowered to Vss at time T34, and the read operation ends.

Advantages of Present Embodiment

Sometimes, the insulating portion ST disposed between the plurality of memory blocks BLK has a connection terminal LI formed therein as a current path in order for a current flowing in a memory string MS to be guided to the source line SL provided on an opposite side to the substrate S during read of a memory block BLK, and so on. In this case, a width in the Y direction of the insulating portion ST broadens as much as required to form the connection terminal LI. As the number of memory blocks BLK aligned in the Y direction increases, a cumulative width in the Y direction of the connection terminals LI ends up getting larger, and area of the memory cell array MCA ends up getting larger.

In this respect, due to the present embodiment, a specific memory block BLK is set as the source block SBK, and this source block SBK is used as the source line. Therefore, the connection terminal LI becomes unnecessary. Hence, it suffices that the insulating portion ST secures a width for separation to be possible between the memory blocks BLK, and for there to be no obstacle to replacement when forming the plurality of conductive layers 110. Therefore, area of the memory cell array MCA can be reduced.

Furthermore, because the source block SBK can be formed with the same configuration as the memory block BLK, a step for forming the connection terminal LI becomes unnecessary. Moreover, since a metal material is not used as the source line, there is an advantage that effects due to heat are few too.

Second Embodiment

Figure 12:
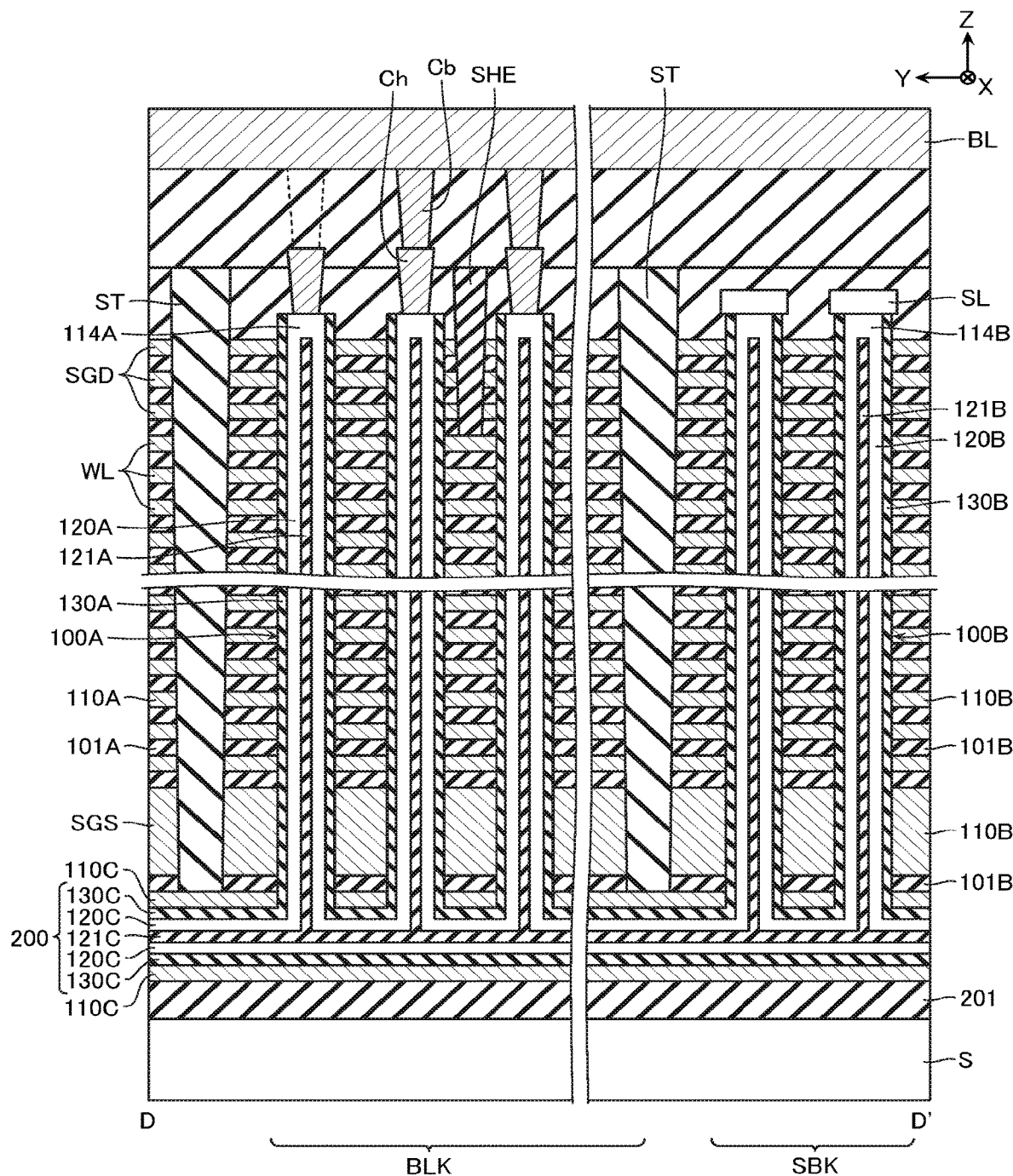
FIG. 12 is a schematic cross-sectional view showing a semiconductor memory device according to a second embodiment.

FIG. 12 is a cross-sectional view of a semiconductor memory device according to a second embodiment, and corresponds to a cross-sectional view taken along the line D-D' of FIG. 7 looking from the direction of the arrows.

In the second embodiment, lower ends of the memory structure 100A and the source structure 100B are connected via a connection layer 200.

As shown in FIG. 12, a third conductive layer 110C functioning as a back gate electrode is provided, via an insulating layer 201, on the substrate S. The connection layer 200 is provided on an inside of the third conductive layer 110C. The connection layer 200 is formed in a mesh-like shape having disposed therein in a zigzag manner a plurality of through-holes penetrated by unillustrated columnar portions joining upper and lower third conductive layers 110C, in a flat plate extending in the X direction and the Y direction. The connection layer 200 is connected to all the lower ends of the memory structures 100A and lower ends of the source structures 100B of one memory cell array MCA.

The connection layer 200 includes a third gate insulating film 130C, a third semiconductor layer 120C, and a third insulating layer 121C disposed in order from sides of the third conductive layers 110C. The third gate insulating film 130C comprises the tunnel insulating film 131, the charge accumulating film 132, and the block insulating film 133 that are similar to those of the first gate insulating film 130A and the second gate insulating film 130B. The third semiconductor layer 120C may include a semiconductor such as non-doped polycrystalline silicon (Si), for example, similarly to the first semiconductor layer 120A and the second semiconductor layer 120B. The third semiconductor layer 120C functions as a channel of a back gate transistor. The third conductive layer 110C may include the likes of polycrystalline silicon including an impurity such as phosphorus (P) or boron (B), for example. The third conductive layer 110C functions as a back gate, hence is connected to an unillustrated contact in the region R2 at its end portion in the X direction, similarly to the first conductive layer 110A and the second conductive layer 110B.

In order to manufacture the semiconductor memory device of the present embodiment, a sacrifice film of the likes of SiN should be formed in a portion where the connection layer 200 is to be formed at a center portion of the third conductive layer 110C, when forming the third conductive layer 110C, and then a certain laminated body is formed on the third conductive layer 110C. Then, in a state where the above-described sacrifice layer has been removed after a memory hole has been formed, the third gate insulating film 130C, the third semiconductor layer 120C, and the third insulating layer 121C are formed, similarly to in a manufacturing step of the memory structure 100A and the source structure 100B.

Due to the present embodiment, the lower ends of the memory structure 100A and the source structure 100B are connected by the connection layer 200 with the back gate, therefore a resistance value between the memory structure 100A and the source structure 100B can be made even smaller.

Third Embodiment

Figure 13:
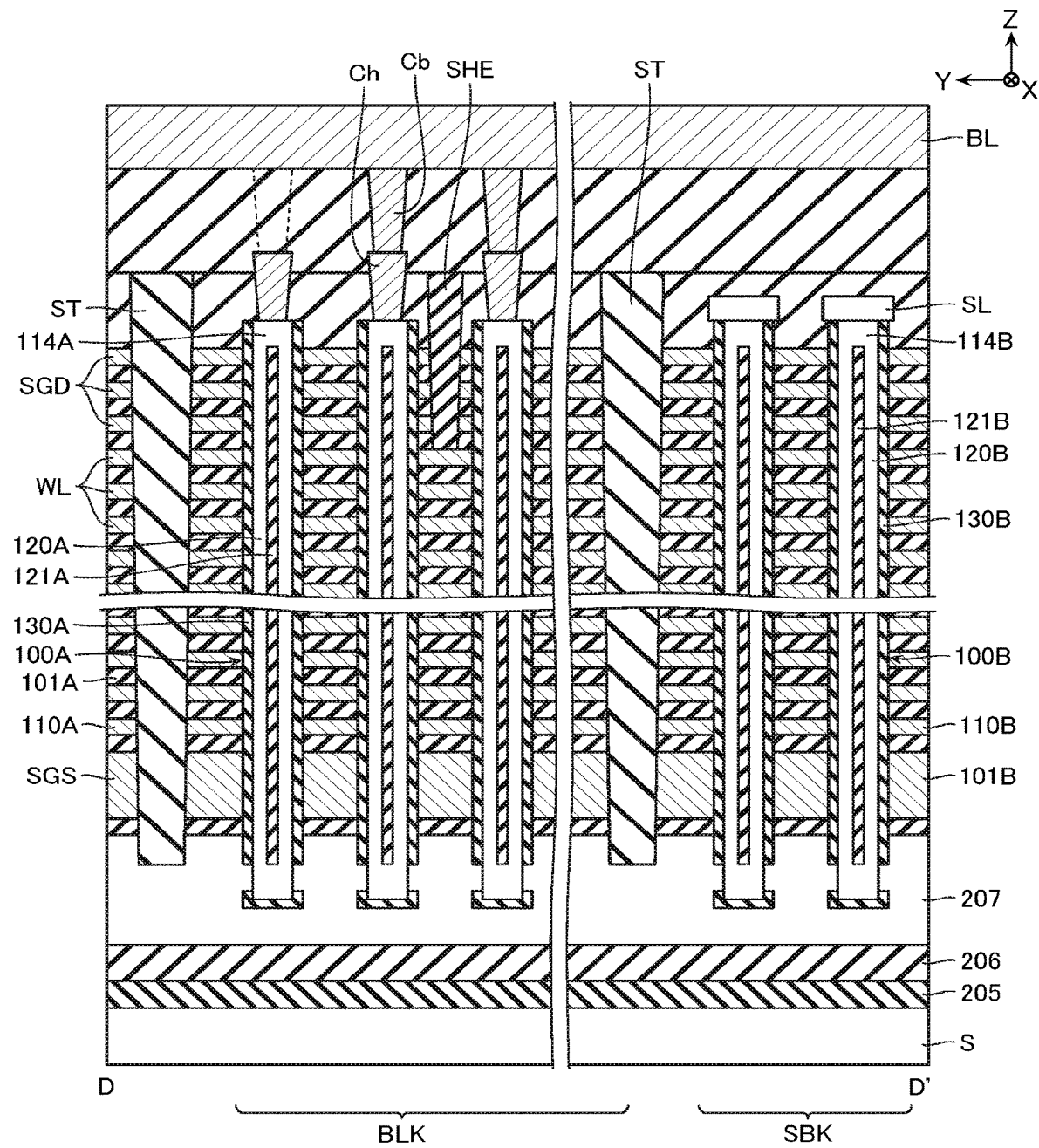
FIG. 13 is a schematic cross-sectional view showing a semiconductor memory device according to a third embodiment.

FIG. 13 is a cross-sectional view of a semiconductor memory device according to a third embodiment, and corresponds to a cross-sectional view taken along the line D-D' of FIG. 7 looking from the direction of the arrows.

In the third embodiment, lower end side surfaces of each of the first semiconductor layer 120A of the memory structure 100A and the second semiconductor layer 120B of the source structure 100B are exposed to be directly connected to a semiconductor layer 207, whereby the memory structure 100A and the source structure 100B are connected.

As shown in FIG. 13, a conductive layer 206 is formed, via an insulating layer 205, on the substrate S. The semiconductor layer 207 is formed on the conductive layer 206. The conductive layer 206 and the semiconductor layer 207 form the source line SC (FIG. 3) in the present embodiment. The conductive layer 206 may include a metal such as tungsten (W), a conductive layer of the likes of tungsten silicide, or another conductive layer, for example. The semiconductor layer 207 may include the likes of polycrystalline silicon including an impurity such as phosphorus (P) or boron (B), for example.

Due to the present embodiment, the lower end side surfaces of the semiconductor layers 120 configuring the memory structure 100A and source structure 100B, and the source line SC (FIG. 3) including the semiconductor layer 207 and conductive layer 206, are directly connected, so a resistance value between the memory structure 100A and the source structure 100B can be made even smaller.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
  a plurality of first conductive layers arranged separated from each other in a first direction;
  a plurality of second conductive layers arranged separated from each other in the first direction, the plurality of second conductive layers being arranged, electrically insulated from the plurality of first conductive layers, at a different position in a second direction intersecting the first direction with respect to the plurality of first conductive layers;
  a plurality of memory structures each comprising a first semiconductor layer extending in the first direction and facing the plurality of first conductive layers, and a first insulating film provided between the first semiconductor layer and the plurality of first conductive layers, a plurality of memory cells being formed at positions where the plurality of first conductive layers and the first semiconductor layer face each other, and the plurality of memory cells being serially connected in the first direction to configure a memory string; and
  a source structure comprising a second semiconductor layer extending in the first direction and facing the plurality of second conductive layers, and a second insulating film provided between the second semiconductor layer and the plurality of second conductive layers, a plurality of transistors being formed at positions where the plurality of second conductive layers and the second semiconductor layer face each other, and the plurality of transistors being serially connected in the first direction,
  respective one ends of the plurality of memory structures and one end of the source structure being electrically connected,
  respective the other ends of the plurality of memory structures being respectively electrically connected to first wirings that differ from each other, of a plurality of first wirings formed in a same layer in the first direction, and
  the other end of the source structure being electrically connected to a second wiring formed in a different layer from the plurality of first wirings in the first direction, wherein
  the respective one ends of the plurality of memory structures and the one end of the source structure are electrically connected via a third semiconductor layer which is electrically connected to side surfaces on respective one end sides of the first semiconductor layer and the second semiconductor layer.

2. The semiconductor memory device according to claim 1, wherein
  the plurality of memory structures include a first memory structure and a second memory structure that are arranged in a third direction intersecting the first direction and the second direction, respective one ends of the first memory structure, the second memory structure, and the source structure are electrically connected to each other, and respective the other ends of the first memory structure and the second memory structure are respectively electrically connected to first wirings that differ from each other, of the plurality of first wirings.

3. The semiconductor memory device according to claim 1, wherein the plurality of second conductive layers are applied with a voltage that sets to ON the plurality of transistors of the source structure.

4. The semiconductor memory device according to claim 1, wherein the plurality of first conductive layers and the plurality of memory structures configured a first memory block and a second memory block that are arranged in the second direction, a plurality of first conductive layers belonging to the first memory block of the plurality of first conductive layers and a plurality of first conductive layers belonging to the second memory block of the plurality of first conductive layers are electrically insulated from each other, and one end of a memory structure in the first memory block of the plurality of memory structures and one end of a memory structure in the second memory block of the plurality of memory structures are electrically connected to the one end of the source structure.

5. A semiconductor memory device comprising:

a plurality of first conductive layers arranged separated from each other in a first direction;

a plurality of second conductive layers arranged separated from each other in the first direction, the plurality of second conductive layers being arranged, electrically insulated from the plurality of first conductive layers, at a different position in a second direction intersecting the first direction with respect to the plurality of first conductive layers;

a plurality of memory structures each comprising a first semiconductor layer extending in the first direction and facing the plurality of first conductive layers, and a first insulating film provided between the first semiconductor layer and the plurality of first conductive layers, a plurality of memory cells being formed at positions where the plurality of first conductive layers and the first semiconductor layer face each other, and the plurality of memory cells being serially connected in the first direction to configure a memory string; and a plurality of source structures each comprising a second semiconductor layer extending in the first direction and facing the plurality of second conductive layers, and a second insulating film provided between the second semiconductor layer and the plurality of second conductive layers, a plurality of transistors being formed at positions where the plurality of second conductive layers and the second semiconductor layer face each other, and the plurality of transistors being serially connected in the first direction, respective one ends of the plurality of memory structures and respective one ends of the plurality of source structures being electrically connected, respective the other ends of the plurality of memory structures being electrically connected to any one of a plurality of first wirings formed in a same layer in the first direction, and respective the other ends of the plurality of source structures being commonly electrically connected to a second wiring formed in a different layer from the plurality of first wirings in the first direction, wherein the respective one ends of the plurality of memory structures and the respective one ends of the plurality of the source structures are electrically connected via a third semiconductor layer which is electrically connected to side surfaces on respective one end sides of the first semiconductor layer and the second semiconductor layer.

6. The semiconductor memory device according to claim 5, wherein the plurality of second conductive layers are applied with a voltage that sets to ON the plurality of transistors of each of the plurality of source structures.

7. The semiconductor memory device according to claim 5, wherein the plurality of first conductive layers and the plurality of memory structures configured a first memory block and a second memory block that are arranged in the second direction, a plurality of first conductive layers belonging to the first memory block of the plurality of first conductive layers and a plurality of first conductive layers belonging to the second memory block of the plurality of first conductive layers are electrically insulated from each other, and one end of a memory structure in the first memory block of the plurality of memory structures and one end of a memory structure in the second memory block of the plurality of memory structures are electrically connected to the respective one ends of the plurality of source structures.

8. The semiconductor memory device according to claim 5, wherein the plurality of source structures are included in a source block.

9. The semiconductor memory device according to claim 8, wherein the plurality of memory structures and the plurality of source structures belonging to the source block are disposed with substantially a same pitch each other.

10. The semiconductor memory device according to claim 1, wherein the third semiconductor layer extends in the second direction and a third direction that intersects the first direction and the second direction, and the third semiconductor layer electrically connects respective one ends of a plurality of memory structures aligned in the third direction of the plurality of memory structures.

11. The semiconductor memory device according to claim 1, wherein the plurality of first wirings extend in the second direction and are arranged in a third direction that intersects the first direction and the second direction.

12. The semiconductor memory device according to claim 5, wherein the third semiconductor layer extends in the second direction and a third direction that intersects the first direction and the second direction, the third semiconductor layer electrically connects respective one ends of a plurality of memory structures aligned in the third direction of the plurality of memory structures, and electrically connects respective one ends of a plurality of source structures aligned in the third direction of the plurality of source structures.

13. The semiconductor memory device according to claim 7, wherein
the plurality of source structures are included in a source block, and
respective plurality of memory structures belonging to the first memory block, respective plurality of memory structures belonging to the second memory block, and the plurality of source structures belonging to the source block are disposed with substantially a same pitch.

14. The semiconductor memory device according to claim 5, wherein
the plurality of first wirings extend in the second direction and are arranged in a third direction that intersects the first direction and the second direction.

\* \* \* \* \*